(12) United States Patent
Boda et al.

(10) Patent No.: US 11,152,921 B1
(45) Date of Patent: Oct. 19, 2021

(54) SYSTEMS AND METHODS FOR CONTROL SIGNAL LATCHING IN MEMORIES

(71) Applicant: QUALCOMM Incorporated, San Diego, CA (US)

(72) Inventors: Veerabhadra Rao Boda, Bangalore (IN); Rahul Sahu, Bangalore (IN); Sharad Kumar Gupta, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/204,421

(22) Filed: Mar. 17, 2021

(51) Int. Cl.
| H03K 3/00 | (2006.01) |
| H03K 3/037 | (2006.01) |
| H03K 5/14 | (2014.01) |
| H03K 19/20 | (2006.01) |
| H03K 3/286 | (2006.01) |
| H03K 3/356 | (2006.01) |

(52) U.S. Cl.
CPC ........... *H03K 3/037* (2013.01); *H03K 3/0375* (2013.01); *H03K 3/2865* (2013.01); *H03K 3/356008* (2013.01); *H03K 5/14* (2013.01); *H03K 19/20* (2013.01)

(58) Field of Classification Search
None
See application file for complete search history.

(56) References Cited

U.S. PATENT DOCUMENTS

| 6,538,471 B1 * | 3/2003 | Stan .................... H03K 3/012 326/40 |
| 6,850,103 B2 * | 2/2005 | Ikeno ................... H03K 3/0375 327/202 |
| 2002/0153934 A1 * | 10/2002 | Yoon .................. H03K 3/356113 327/333 |
| 2004/0140842 A1 * | 7/2004 | Lee .................... H03K 3/356113 327/333 |
| 2009/0027102 A1 * | 1/2009 | Fayed ..................... H03K 3/012 327/333 |
| 2011/0176653 A1 * | 7/2011 | Veggetti ................ H03K 3/0375 377/64 |
| 2013/0222031 A1 * | 8/2013 | Behrends .............. H03K 3/0375 327/203 |
| 2013/0335127 A1 * | 12/2013 | Kim ..................... H03K 3/0375 327/198 |
| 2014/0210535 A1 * | 7/2014 | Bartling ............ H03K 3/356104 327/199 |
| 2016/0065188 A1 * | 3/2016 | Singhal ............ H03K 3/356008 327/203 |
| 2016/0301396 A1 * | 10/2016 | Jayapal ................ H03K 3/0375 |
| 2017/0012611 A1 * | 1/2017 | Escobar ................. H03K 3/037 |
| 2018/0019735 A1 * | 1/2018 | Roy .................... G11C 13/0023 |

* cited by examiner

*Primary Examiner* — Tuan T Lam
(74) *Attorney, Agent, or Firm* — Haynes and Boone, LLP

(57) ABSTRACT

Systems and methods for propagating control signals in memories are described. One implementation includes a plurality of logic gates and a latch coupled between a control signal input and a delay line. The latch may store the value of the control signal before the control signal floats, thereby reducing the risk of incorrect signal propagation. Furthermore, the implementation may also include a clamp signal that isolates the plurality of logic gates before the control signal floats and continues to isolate the plurality of logic gates until after the control signal returns to either a digital one or a digital zero. The clamp signal may reduce leakage by disconnecting transistors within the logic gates from their power supply.

28 Claims, 6 Drawing Sheets

SYSTEMS AND METHODS FOR CONTROL SIGNAL LATCHING IN MEMORIES

TECHNICAL FIELD

The present application relates, generally, to control signals in memories and, more specifically, to memories that propagate control signals through delay lines.

BACKGROUND

Some systems may include processing devices having associated memory arrays. For instance, a modem may have associated large memory (LMEM) arrays, which store data used for processing. Furthermore, some systems include power collapse functions to save power, such that when a processing device is not being used, it may be disconnected from its power supply in whole or in part to save both leakage power and dynamic power. When the processing device is to be used again, then power may be restored, and the processing device may wake and continue with normal operation, and power may be consumed both for dynamic power and leakage.

An example system uses multiple LMEMs, and those LMEMs may go to sleep and wake up together as their associated processing device is either disconnected from power or woken up. To avoid a large current when the multiple LMEMs wake up, some systems use delay lines between each of the LMEMs to propagate a sleep or wake signal. Such delay lines may cause a staggered wake up, thereby distributing the inrush current over a larger time.

Delay lines cause design issues of their own. For instance, signal generation during wake up should be timed appropriately to keep from propagating an incorrect value for a sleep signal or a wake signal from LMEM to LMEM. This may make it difficult to address other issues, such as clamping at an input of a delay line. Clamping may be used to reduce or prevent leakage current at the LMEMs when an input may float due to its propagating circuit being power collapsed. For instance, if a sleep or wake signal may float when its propagating circuit is power collapsed, then the sleep or wake input at the LMEM may experience leakage current if no other action, such as clamping, is taken. However, clamping may complicate signal timing and has the potential to cause an incorrect signal to be propagated along a delay line.

Accordingly, there is a need in the art for techniques for propagating control signals in memory devices, where those techniques both reduce leakage and prevent incorrect signal propagation.

SUMMARY

Various implementations provide systems and methods for propagating control signals in memories. One implementation includes a plurality of logic gates and a latch coupled between a control signal input and a delay line. The latch may store the value of the control signal before the control signal floats, thereby reducing the risk of incorrect signal propagation. Furthermore, the implementation may also include a clamp signal that isolates the plurality of logic gates before the control signal floats and continues to isolate the plurality of logic gates until after the control signal returns to either a digital one or a digital zero. The clamp signal may reduce leakage by disconnecting transistors within the logic gates from their power supply.

According to one implementation, a semiconductor device includes: a first memory array having a first input and a first output and a delay line coupled to the first output; a control logic coupled to the first input; a latch disposed between the control logic and the delay line; and a plurality of logic gates between the control logic and the latch, the plurality of logic gates positioned at a data node and a data bar node of the latch, wherein each logic gate is coupled with a first control signal, and the first control signal is coupled with a gate of a transistor coupling the plurality of logic gates to a first power supply.

According to one implementation, a method of operating a semiconductor device, the method includes: receiving a sleep signal at an input to a memory array from a control logic; storing a value of the sleep signal in a latch, wherein the latch is disposed between the input and an inverter chain of the memory array; isolating a plurality of logic gates between the input and the latch from a power supply; and after isolating the plurality of logic gates, allowing the sleep signal to float.

According to one implementation, an apparatus, includes: a memory array; a control logic configured to provide a sleep signal to the memory array; an input circuitry having an input and an output, the input of the input circuitry configured to receive the sleep signal from the control logic, and the input circuitry configured to operate in a first power domain; a latch having a latch input and a latch output, the latch input coupled to the output of the control logic, the latch configured to store the sleep signal, wherein the input circuitry is configured to be electrically isolated from a power rail of the first power domain before the sleep signal floats; and a delay line coupled between the latch output and the memory array.

According to one implementation, a system on chip (SOC) includes: a memory array; means for providing a sleep signal to the memory array; means for receiving the sleep signal from the sleep signal providing means, the sleep signal receiving means including a plurality of logic circuits operating in a first power domain and being configured to be electrically isolated from a power rail of the first power domain during a time period in which the sleep signal floats; means for storing a value of the sleep signal during the time period in which the sleep signal floats; and means for causing a propagation delay in transmitting the value of the sleep signal to the memory array.

DETAILED DESCRIPTION

Figure 1:
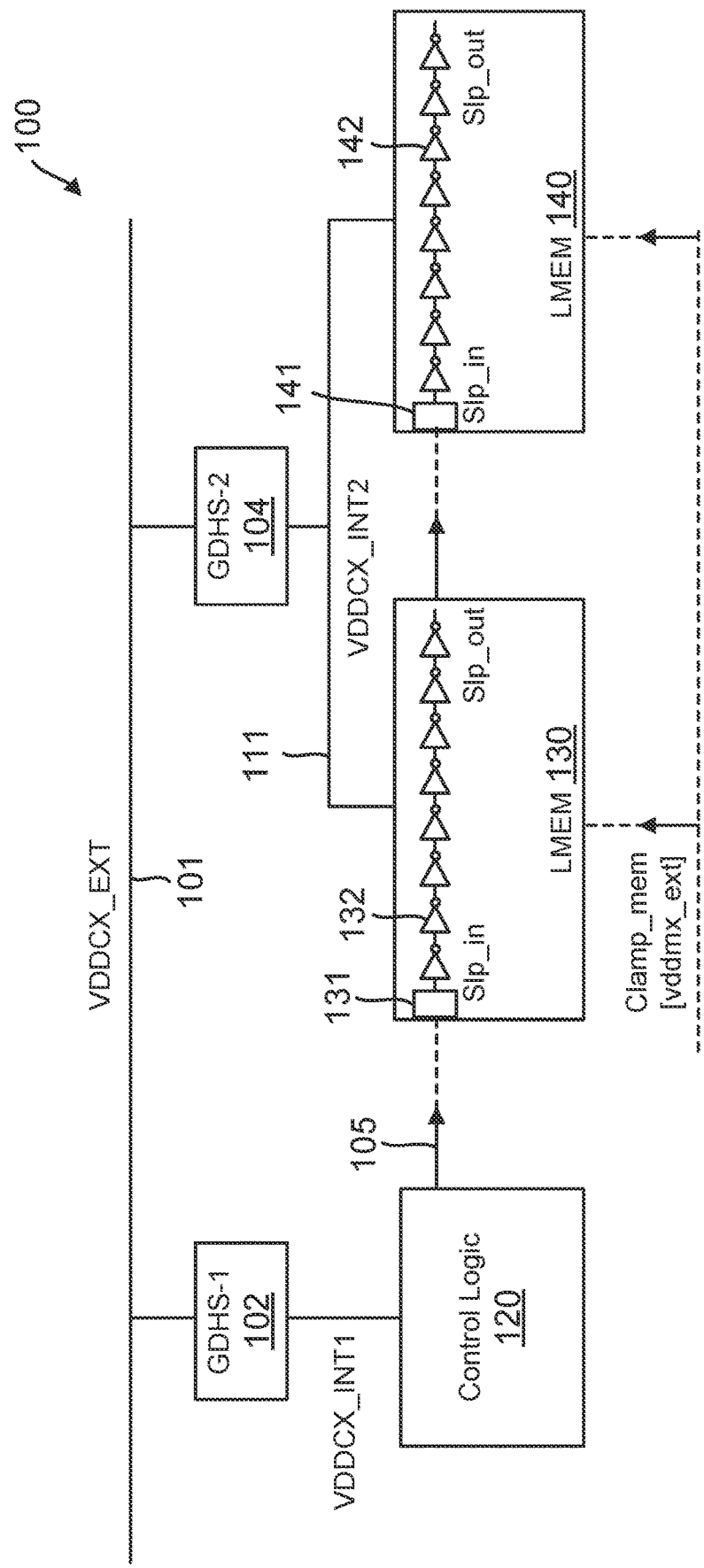
FIG. 1 is a simplified diagram illustrating an example semiconductor-based system, according to one implementation.

Various implementations provided herein include systems and methods for reducing leakage and ensuring that control signals are propagated correctly along delay lines. One implementation includes a semiconductor device that has a first memory array having a first input and a first output as well as a delay line that is coupled to the first output. Control logic is coupled to the first input to provide a control signal. An example of control logic may be a modem that is associated with the memory array, where the memory array may include a large memory (LMEM), though any appropriate memory array is within the scope of implementations. In this example, the control signal may include a sleep and wake signal that is provided by the control logic to the memory array, and where the control signal is propagated over the delay line to a second memory array.

Continuing with the example, a latch is disposed between the control logic and the delay line and may be used to store a value of the control signal when a conductor carrying the control signal floats. The semiconductor device may further include multiple logic gates between the control logic and the latch, wherein the logic gates propagate the control signal to the inputs of the latch. A clamp signal may be used as another control signal at an input to at least some of the logic gates. Furthermore, the clamp signal may be used to isolate the logic gates from their power supply. For example, the clamp signal may be applied to the gate of a transistor that is coupled between the logic gates and the power supply. Accordingly, the clamp signal may be used to isolate the logic gates before the conductor carrying the control system floats.

Continuing with the example, during normal operation, the control signal (e.g., a sleep and wake signal) may be provided by the control logic to the logic gates. The logic gates are powered during times when the control signal is either a digital one or a digital zero. However, at some points, the control logic might be power collapsed, which may cause its control signal output (and the conductor on which the control signal is coupled to the logic gates) to float. Various implementations allow for the clamp signal to isolate the logic gates and for the latch to store the value of the control signal before the control signal floats.

Another implementation includes an apparatus having a memory array and control logic that is configured to provide a sleep signal to the memory array. As in the example above, the memory array may be an LMEM, and the control logic may include a processing device such as a modem which is associated with the LMEM. The apparatus also includes input circuitry having an input and an output, the input of the input circuitry being configured to receive the sleep signal from the control logic, and the input circuitry is also configured to operate in a first power domain.

Continuing with the example, the apparatus may also include a latch having a latch input and a latch output. The latch input may be coupled to the output of the control logic, and the latch may be configured to store the sleep signal. Furthermore, the input circuitry may be configured to be electrically isolated from a power rail of the first power domain before the sleep signal floats. The input circuitry may further be configured to be electrically coupled to the power rail after the sleep signal returns to a digital zero or a digital one (e.g., power supply voltage level or ground). Also, as in the example above, a delay line may be coupled between the latch output and the memory array, thereby propagating the sleep signal to the memory array.

Various implementations may also include methods. An example method may include receiving a sleep signal at an input to a memory array. For instance, the sleep signal may be received from control logic, such as a processor core, a modem, or other device. The method may further include storing the value of the sleep signal in a latch, the latch being disposed between the input and a delay line of the memory array. In one example, the delay line may be implemented as an inverter chain, though the scope of implementations is not limited to any particular delay line architecture.

The method may further include isolating a plurality of logic gates which are located between the input and the latch. Isolating the plurality of logic gates may include turning off a transistor which is placed between the logic gates and the power supply. Once the logic gates are isolated and the value of the sleep signal is stored in the latch, then the sleep signal may be allowed to float. After the sleep signal returns to either a digital one or a digital zero, the plurality of logic gates may be powered up once again.

Various implementations may include advantages over other systems. One advantage includes reducing possibility of incorrect signal propagation on the delay line. Specifically, the latch may be used to store the value of the sleep signal (e.g., a one or a zero) before the sleep signal floats. The latch itself may provide a way to keep the value of the control signal stable during a time in which the modem or other processing device may be powered down. The modem or other processing device may eventually be powered up, and the latch has stored the proper value of the control signal and will propagate the value along the delay line.

Furthermore, various implementations may also reduce leakage current. For instance, when the sleep signal floats, that floating voltage is applied to gates of transistors of the logic gates. If the transistors of the logic gates are powered, then there may be some leakage current from the power supply to ground within each of those logic devices. By contrast, various implementations may power down the logic gates before the sleep signal floats, thereby ensuring that a floating voltage is not applied to gates of the transistors when the transistors are capable of conducting current.

FIG. 1 is a simplified diagram illustrating an example semiconductor-based system 100, according to one implementation. In this example, the semiconductor-based system 100 may include a portion of a system on chip (SOC), with the example illustrating control logic 120 and its associated large memories (LMEM) 130, 140 while leaving out other instances of control logic and memories for ease of illustration.

Control logic 120 may include a processing device, such as a central processing unit (CPU), a graphics processing unit (GPU), a modem, and/or the like. Control logic 120 in this example is associated with LMEMs 130, 140 and may use LMEMs 130, 140 during normal operations as random-access memory (RAM) to store operating instructions and data. Control logic 120 also transmits control signals, such as a sleep and wake signal, to the LMEMs 130, 140. For instance, when the larger system powers down the control logic 120, part of the power down process may include the control logic 120 using the sleep and wake signal to cause LMEMs 130, 140 to enter a sleep state. In this example, the sleep state may include a power-reduced, clock-reduced, or power collapsed state as appropriate. Control logic 120 may transmit the sleep and wake signal on the conductive line 105, where it is received at a latch 131.

In this example, control logic 120 is associated with two LMEMs 130, 140. The LMEMs 130, 140 may each include a multitude of memory bit cells arranged into rows (accessible via word lines) and columns (accessible via bitlines). The scope of implementations is not limited to any size for the LMEMs 130, 140, as any appropriate size memory device may be adapted according to the principles described herein. In addition to memory bit cells arranged into rows and columns, LMEMs 130, 140 may each include other supporting circuitry, such as latches 131, 141 and delay lines 132, 142. Furthermore, while FIG. 1 shows two LMEMs 130, 140, it is understood that other implementations may include any appropriate number of LMEMs. Also, other processing devices (not shown) within the larger system may be associated with their own LMEMs (not shown) and operate similarly to the example of FIG. 1.

When control logic 120 transmits a value for the sleep and wake signal onto conductive line 105, the sleep and wake signal is received at latch 131. Depending upon the particular operation, latch 131 may either latch the value of the sleep and wake signal and hold that value or may transmit the sleep and wake signal on delay line 132. The purpose of delay line 132 is to provide a time delay between when LMEM 130 wakes up and when LMEM 140 wakes up. In other words, the delay line 132 implements a known propagation delay to the sleep and wake signal so that LMEMs 130, 140 wake up in a staggered manner rather than substantially simultaneously. The particular time delay may be chosen and implemented using simulation and/or testing to choose and build a sufficient number of inverters in the delay line 132 to keep wakeup inrush current within an acceptable amperage range. That acceptable amperage range may be different from device to device. Alternatively, the delay line 132 may be implemented using a programmable delay line, which can be programmed (or configured) to provide different delays as desired in the specific use case.

FIG. 1 also illustrates delay line 142 within LMEM 140. Delay line 142 may be used to provide a time delay between a wake up of LMEM 140 and a wakeup of another LMEM (not shown) within a chain of LMEMs. In an example in which only two LMEMs 130, 140 are used, delay line 142 and latch 141 may be omitted, as there may be no use for further delay after LMEM 140 wakes up.

Power rail 101 is associated with power domain VDDCX_EXT. Control logic 120 is coupled with power rail 101 through global distributed head switch (GDHS) 102, and LMEMs 130, 140 are coupled with power rail 101 through GDHS 104. This illustrated arrangement allows power to be collapsed independently for control logic 120 and for LMEMs 130, 140. LMEMs 130, 140 are both coupled to GDHS 104 through power rail 111. An additional control signal, a clamp signal, shown as Clamp_mem, is provided to LMEMs 130, 140 and is associated with a different power domain VDDMX_EXT. The control signal Clamp_mem is associated with power domain VDDMX_EXT so that it is independent of power domain VDDCX_EXT and can be used to isolate various logic gates (described with respect to FIG. 2) from one or more power rails associated with power domain VDDCX_EXT. Specifically, the control signal Clamp_mem can be used to isolate logic gates within latches 131, 141 from power rail 111 while conductive line 105 is at a floating voltage.

While the example of FIG. 1 refers to a sleep and wake signal, it is also equally correct and accepted to simply refer to the signal as a sleep signal. For instance, a signal that controls a sleep and wake state may be referred to as a sleep signal or a wake signal. Additionally, while the examples herein describe use of the circuits and methods to transmit a sleep signal, it is understood that the scope of implementations is not limited only to sleep signals. Rather, the scope of implementations may include transmitting any control signal from control logic to one or more memory devices using a latch and delay line.

Figure 2:
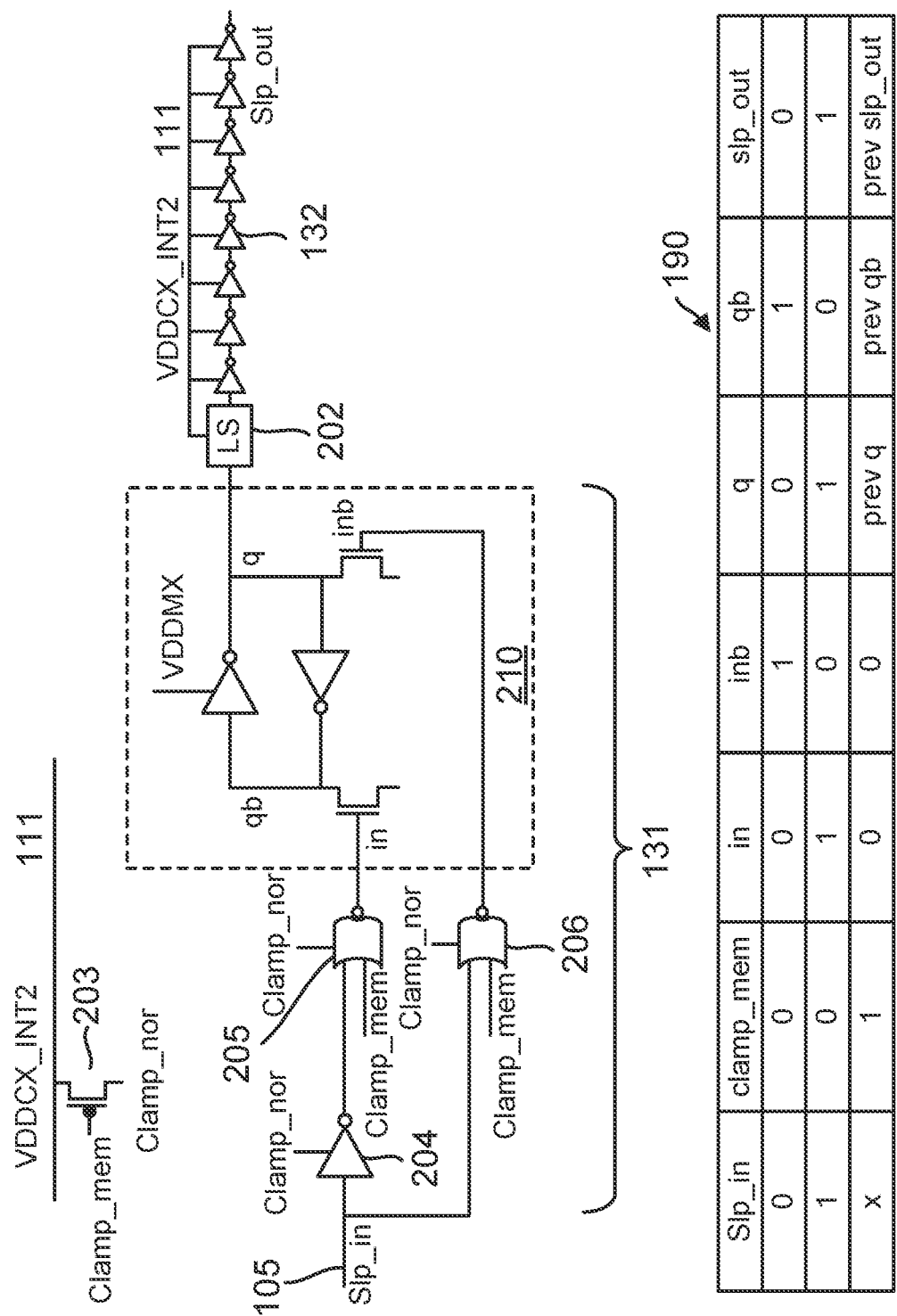
FIG. 2 is a simplified diagram of a latch and a delay line of FIG. 1, according to one implementation, according to one implementation.

Reference is now made to FIG. 2, which is a simplified diagram of latch 131 and delay line 132, according to one implementation. In this example, latch 131 is shown to include a jam latch 210 and logic gates 204-206. It is understood that latch 141 and delay line 142 would be constructed the same as or similar to the implementation shown in FIG. 2 and would operate the same as or similar to the implementation shown in FIG. 2. FIG. 2 also includes a truth table 190 to illustrate how values of the sleep signal (Slp_in) are received and propagated during operation.

The sleep signal is received at conductive line 105, which is also at an input of inverter 204 and an input of NOR gate 206. The output of inverter 204 is fed to an input of NOR gate 205. Both of the NOR gates 205, 206 receive the clamp signal Clamp_mem as an input as well. The inverter 204 and the NOR gates 204-206 are input circuitry for the latch 210. Each of the NOR gates 205, 206 outputs a digital one if all inputs to the respective NOR gate are zero. Otherwise, the output of a NOR gate 205, 206 is a digital zero. The NOR gates 205, 206 act as inputs to the latch 210. For instance, NOR gate 205 provides the latch input (in), whereas the NOR gate 206 provides the latch input (inb). The latch output (q) is provided to level shifter 202, which changes a voltage level of the latch output q to be operable within the power domain (or voltage domain) in which the delay line 132 operates.

Each of the NOR gates 205, 206 receives the clamp signal Clamp_mem as an input. The clamp signal Clamp_mem is held to a value of digital zero unless the sleep signal is about to float or is currently floating. When Clamp_mem is applied to the gate of P-channel metal-oxide-semiconductor (PMOS) transistor 203 at a value of digital zero, transistor 203 is on and logic gates 204, 205, 206 receive power from the voltage rail 111, which is associated with the power domain VDDCX_INT2. However, when Clamp_mem is a value of digital one, transistor 203 is off, and it isolates logic gates 204, 205, 206 from the power rail 111, thereby preventing or reducing current flowing through the transistors that make up the individual logic gates 204, 205, 206.

When Clamp_mem is a digital zero, then the latch inputs in, inb have complementary values dependent upon the value of the sleep signal Slp_in so that when the sleep signal is a digital zero, the value at the output of the latch 210 is also a digital zero, and that digital zero is propagated along delay line 132 where it is output as Slp_out. Although not shown in FIG. 2, Slp_out may be propagated to latch 141 of LMEM 140, where it is treated as a sleep signal input. Similarly, when the sleep signal value is a digital one, the value at the output of the latch 210 is also a digital one, and that digital one is propagated along delay line 232. In sum, the latch 210 stores and holds the value of Slp_in, and makes it available to the delay line 232.

As noted above at FIG. 1, the logic to generate the sleep signal is at control logic 120, which is associated with power subdomain VDDCX_INT1. By contrast, the logic to generate the clamp signal Clamp_mem may be generated by another piece of control logic (not shown), which may be powered by another power domain, such as VDDMX_EXT. In one example, a CPU on a same SOC as the control logic 120 may execute computer readable code to provide the function of an operating system kernel, and that operating system kernel may generate, or cause to be generated, the clamp signal. That same operating system kernel may also determine sleep and wake times for logic circuit 120 as well as for other logic components on the SOC. Of course, the scope of implementations is not limited to any particular circuit or operation to generate the clamp signal or other control signals. For instance, the operating system kernel may have a higher-level sleep signal that it transmits to control logic 120 when it is appropriate for control logic 120 to sleep or wake, and that higher-level sleep signal may trigger control logic 120 to generate a particular value for Slp_in.

Now looking to the truth table 190, when the sleep signal is a digital zero, the clamp signal is also a digital zero. Thus, the output of nor gate 205, which is the latch input in, is a digital zero. The output of nor gate 206, which is latch input inb, is a digital one. The output q of the latch 210 is a digital zero, which is propagated along delay line 132.

When the sleep signal is a digital one, the clamp signal is also a digital zero. The clamp inputs in and inb are a digital one and a digital zero, respectively. The output of the latch 210 is a digital one, which is propagated along the delay line 132.

The third row of the truth table 190 illustrates the scenario when the sleep signal is floating, e.g., when the conductive line 105 has a floating voltage, such as when control logic 120 is power collapsed. The third row of the truth table 190 is described with respect to FIGS. 3 and 4.

Figure 3:
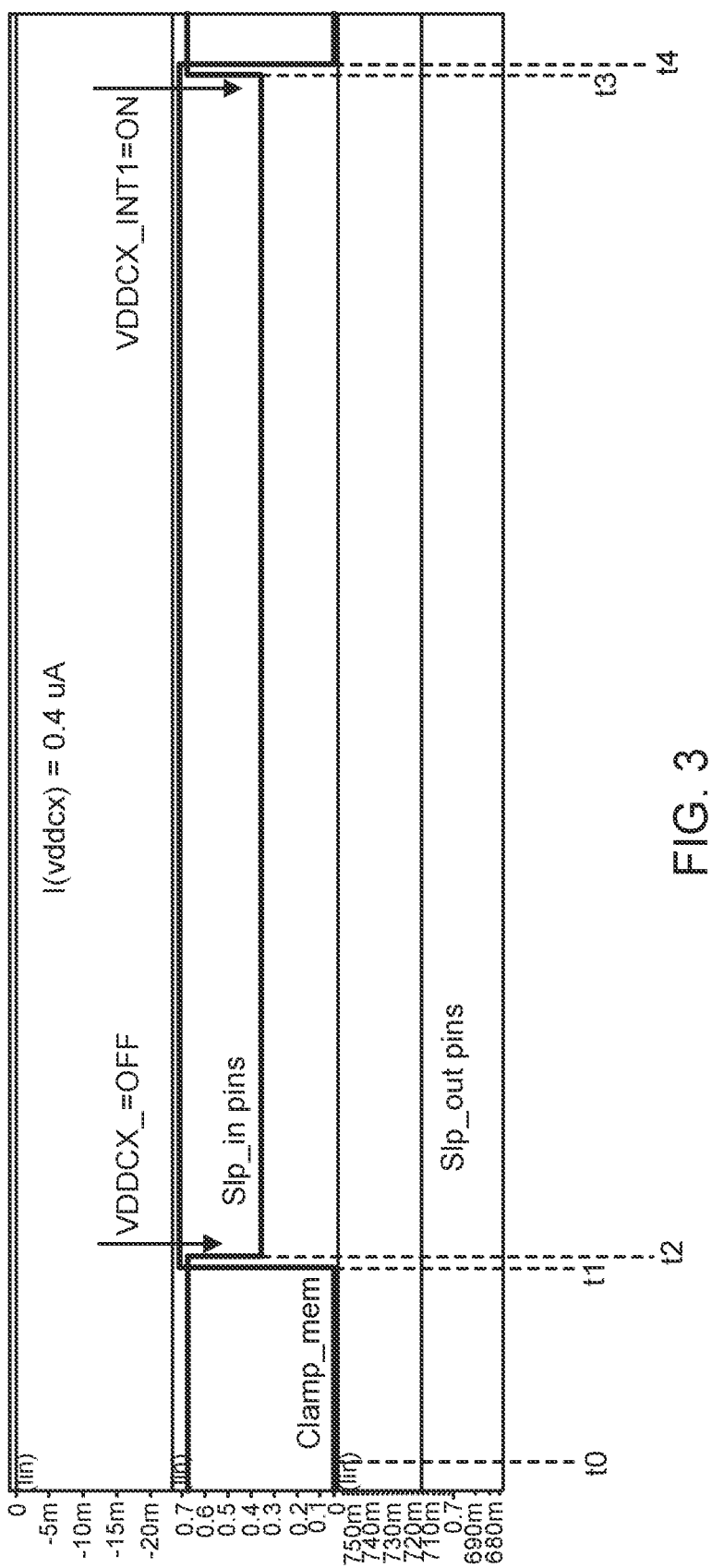
FIG. 3 is a timing diagram of operation of the semiconductor-based system of FIG. 1, according to one implementation.

The example of FIG. 3 is a timing diagram illustrating a transition of the sleep signal Slp_in from a digital one to floating and then back to a digital one. At time t0, clamp Mem is a digital zero, and the sleep signal is a digital one. At time t1, Clamp_mem transitions from a digital zero to a digital one. The transition of the Clamp_mem signal may be under control of e.g., an operating system kernel that anticipates that the control logic 120 will be powered down. Thus, before VDDCX_INT 1 is powered down, which causes the sleep signal to float, Clamp_mem goes to a digital one, which isolates the logic gates 204-206.

At time t2, after Clamp_mem has transitioned to one, the operating system kernel power collapses the control logic 120 so that the conductive line 105 and any associated sleep pins transition to a floating voltage. Looking at the truth table 190, the floating voltage associated with the sleep signal is indicated as "x", and Clamp_mem is controlled to be a one. This causes both of the latch inputs in and inb to go to zero, which puts the latch 210 in latch mode. The output q of the latch 210 keeps its previous value of one, which also maintains the value of Slp_out.

At time t3, control logic 120 is powered up, which causes the sleep signal to re-attain its value of one. Shortly after that time t4, the operating system kernel de-asserts Clamp_mem so that power is restored to the logic gates 204-206. Since Clamp_mem is de-asserted, and since the sleep signal has transitioned to a value of one, the latch inputs in and inb return to the states shown in the second row of the truth table 190. Thus, according to the example of FIG. 3, the system isolates the logic gates 204-206 and latches the value of the sleep signal before the sleep signal floats. The system continues to isolate the logic gates 204-206 until after the sleep signal is no longer floating.

Figure 4:
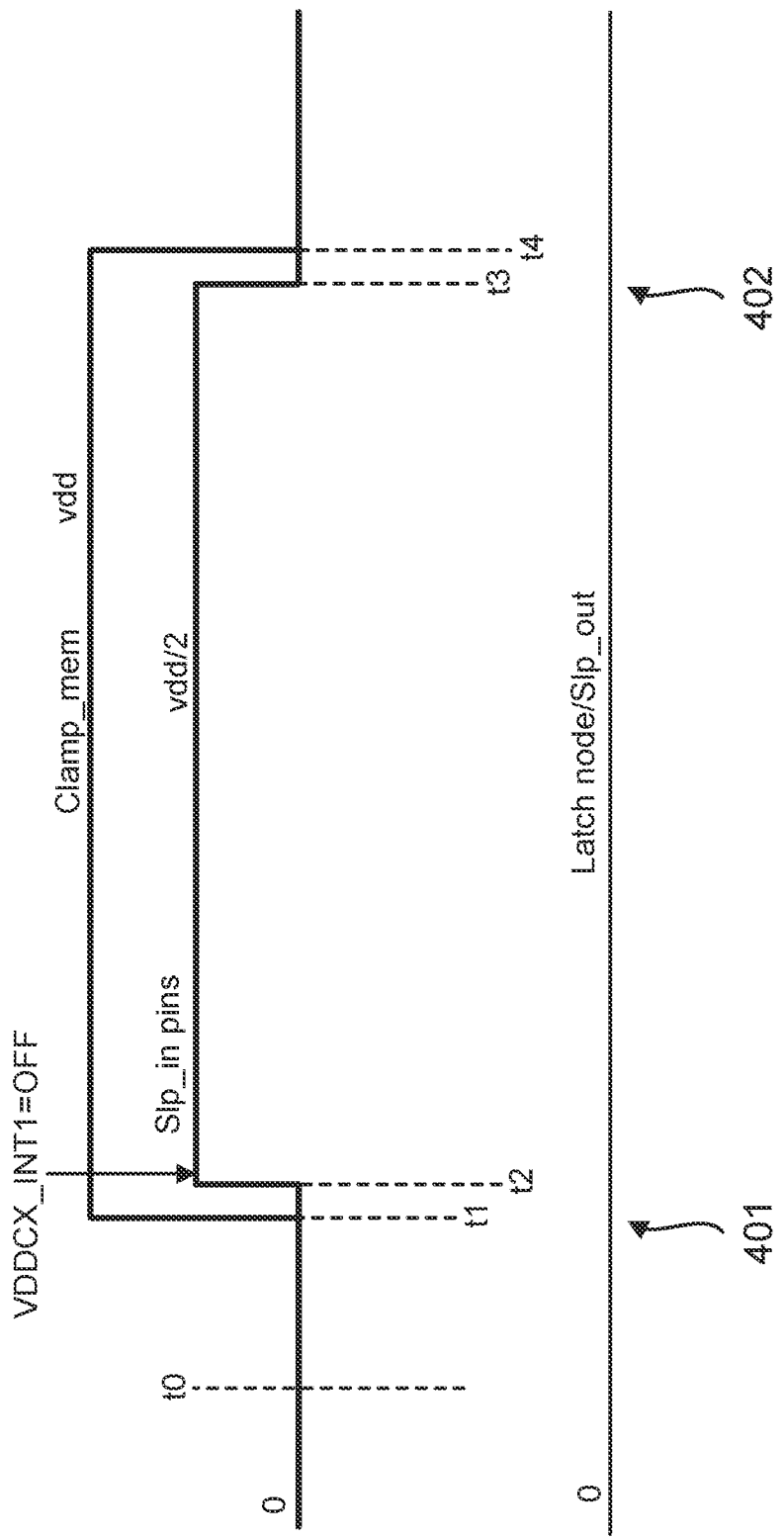
FIG. 4 is a timing diagram of operation of the semiconductor-based system of FIG. 1, according to one implementation.

Moving to FIG. 4, it is a timing diagram illustrating a transition of the sleep signal Slp_in from a digital zero to floating and then back to a digital zero, according to one implementation. At time t0, Clamp_mem and the sleep signal Slp_in are both zero, such as is described with respect to the first row of the truth table 190. However, in anticipation of powering down the control logic 120, the operating system kernel may then assert Clamp_mem at time t1. Asserting the Clamp_mem signal causes the logic gates 204-206 to be isolated from their power rail 111 and causes the latch 210 to store the value (digital zero) of the sleep signal, such as is illustrated in the third row of the truth table 190.

At time t2, the operating system kernel may power down control logic 120, thereby causing the sleep signal and its associated pins to achieve a floating voltage of approximately VDD/2. The control logic 120 is powered down until time t3, when it is powered up and the value of the sleep signal transitions from floating to a digital zero. The operating system kernel then controls Clamp_mem to be de-asserted at time t4, thereby returning the state of the system to that shown in the first row of the truth table 190.

The result of the operation of FIG. 4 is that the output value of the latch and the Slp_out signal maintains a value of zero, even though the value of the sleep signal Slp_in was floating during part of that time. Similarly, at FIG. 3 the output value of the latch and the Slp_out signal maintains a value of one, despite the sleep signal floating during part of the time.

An advantage of the operations of FIGS. 3 and 4 is that the latch 210 operates to prevent propagation of an incorrect sleep signal value. Preventing propagation of an incorrect sleep value may be expected to reduce or eliminate unwanted or harmful states in the system as it transitions in and out of sleep. Another advantage of the operations of FIGS. 3 and 4 is that the logic gates 204-206 are isolated from their power supply when the sleep signal is floating. Such isolation is generally expected to result in a low level of leakage current while the sleep signal floats. For instance, simulation of the FIGS. 3 and 4 operations shows a leakage current as low as 0.4 µA, though the scope of implementations is not limited to any particular amount of leakage current. Reducing leakage current is generally advantageous in that it may increase battery life in a mobile device or other computing device.

Figure 5:
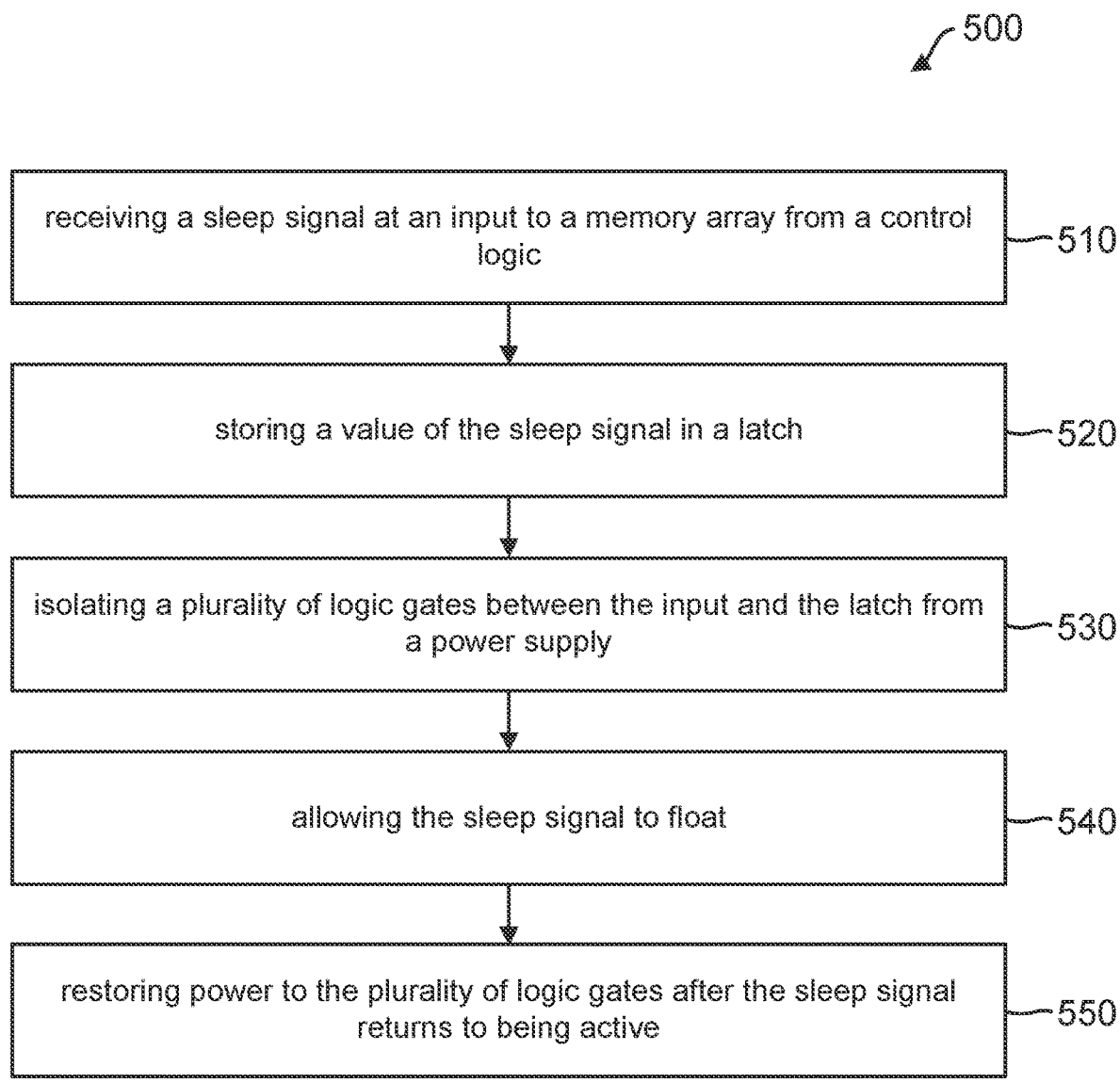
FIG. 5 is an illustration of a method of propagating sleep signals, according to one implementation.

A flow diagram of an example method 500 of propagating a sleep signal or other control signal is illustrated in FIG. 5. In one example, method 500 is performed by the circuits shown in FIGS. 1-2, as they receive a sleep signal and a clamp signal. In some examples, a power management unit either within or outside of a CPU includes processing circuitry that executes computer readable instructions to perform cause the logic circuit to sleep and to provide a clamp signal to logic gates.

At action 510, the method includes receiving a sleep signal at an input to a memory array from a control logic. In the examples of FIGS. 1-2, the sleep signal Slp_in is received on conductive line 105 to the latches 131, 141. The sleep signal may be a digital one or a digital zero. Examples of memory arrays includes LMEMs 130, 140, though the scope of implementations may include any appropriate memory array.

At action 520, the value of the sleep signal is stored in a latch. An example of a latch includes latch 210 of FIG. 2. The latch 210 stores the value of the sleep signal during its latch mode, when Clamp_mem is asserted and both of the latch inputs in and inb are set to zero. I At action 530, the method includes isolating a plurality of logic gates between the input and the latch. The plurality of logic gates are isolated from a power supply to which they are coupled. In the example of FIGS. 1-2, the isolating is performed by applying the clamp signal Clamp_mem at a value of one to a gate of a PMOS transistor, which is disposed between the power rail 111 and the logic gates 204-206.

In the example of FIGS. 1-2, the actions 520-530 are performed by asserting the Clamp_mem signal. The Clamp_mem signal is a control signal, which is associated with a power supply different from the power supply powering the logic circuit 120 and the logic gates 204-206. The clamp signal is received as an input to at least some of the logic gates (e.g., nor gates 205-206), thereby forcing both nor gates and their associated latch inputs to a value of zero.

At action 540, the sleep signal is allowed to float. In the example of FIGS. 1-2, the sleep signal is received on conductive line 105 from the logic circuit 120. When the logic circuit 120 is power collapsed, then its sleep signal output on conductive line 105 is not coupled to either VDD or ground and, thus, the voltage level of the sleep signal is neither a digital one or a digital zero. In the example of FIGS. 3 and 4, the plurality of logic gates are isolated from a time before the sleep signal floats to a time after the sleep signal returns to either a digital one or a digital zero voltage level.

At action 550, power is restored to the plurality of logic gates after the sleep signal returns to being active (e.g., when the sleep signal is no longer floating). An example is shown in FIGS. 3 and 4, where the signal Clamp_mem is de-asserted after the Slp_in signal is transitioned to either a one or a zero from floating. In other words, the logic gates are isolated, and the latch is in latch mode, during the entire time that the sleep signal is floating, including times just before (t1 to t2) the sleep signal floats and just after (t3 to t4) the sleep signal returns to active.

Although not shown in FIG. 5, the method 500 may further include propagating a value of the sleep signal on a delay line to a subsequent memory array, such as shown above in FIGS. 1-2.

The scope of implementations is not limited to the specific actions shown in FIG. 5. Rather, other implementations may add, omit, rearrange, or modify one or more the actions. In one example, an implementation may repeat actions 510-550 multiple times during normal operation. For instance, during operation of an SOC in a mobile device, the operating system kernel may force various different logic circuits into and out of power collapsed states. Accordingly, the techniques and circuits discussed herein may be used to propagate sleep signals from a logic circuit, going to sleep or waking up, and through a multitude of memory devices separated by delay lines.

Various implementations described herein may be suitable for use in a system on chip (SOC). An example of a SOC includes a semiconductor chip having multiple processing devices within it, including a graphics processing unit (GPU), a central processing unit (CPU), a modem unit, a camera unit, and the like. In some examples, the SOC may be included within a chip package, mounted on a printed circuit board, and disposed within a portable device, such as a smart phone or tablet computer. However, the scope of implementations is not limited to a chip implemented within a tablet computer or smart phone, as other applications are possible.

Figure 6:
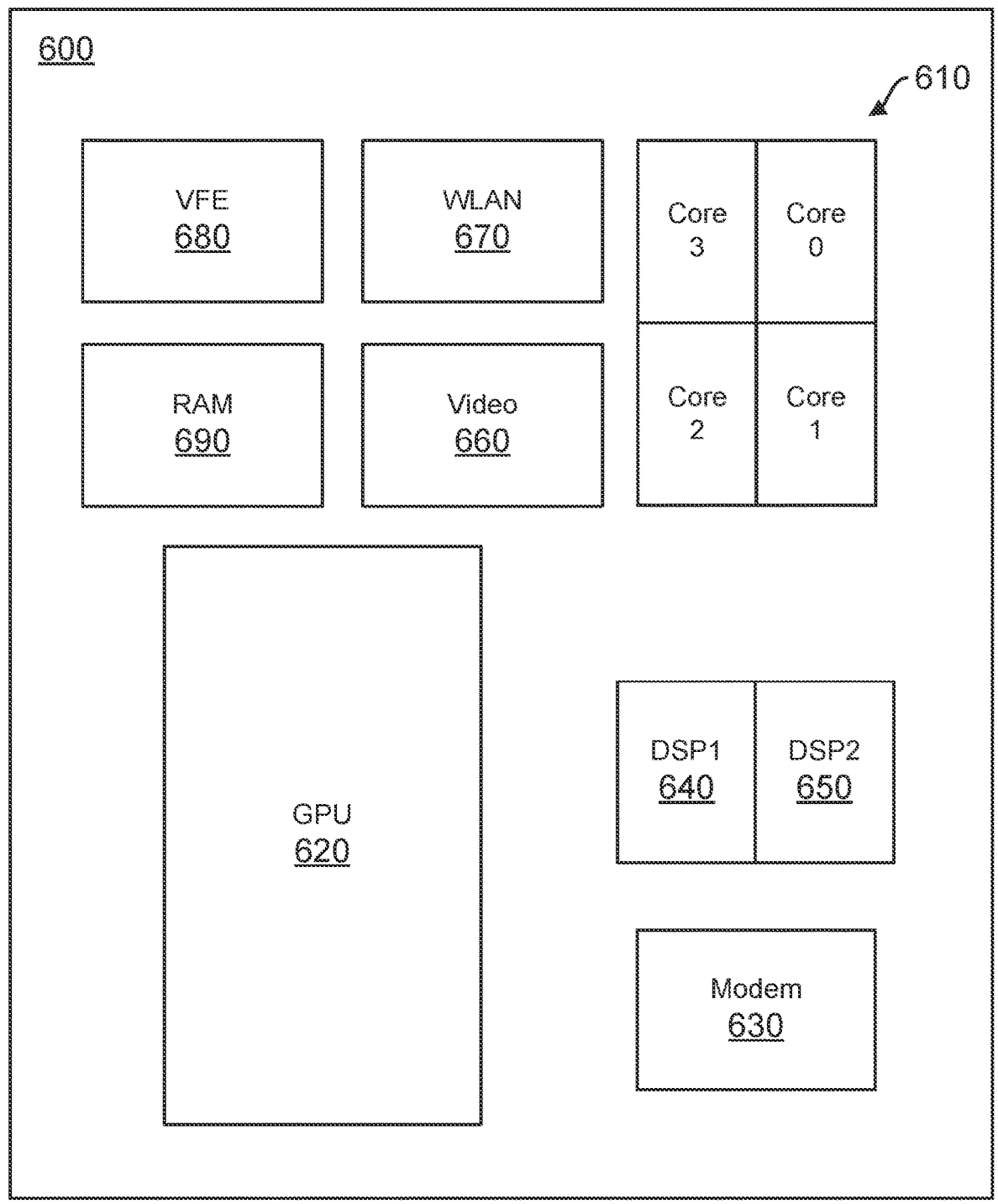
FIG. 6 is an illustration of an example system on chip (SOC), in which may be built the circuits of FIGS. 1 and 2, according to one implementation.

FIG. 6 is an illustration of example SOC 600, according to one implementation. In this example, SOC 600 is implemented on a semiconductor die, and it includes multiple system components 610-690. Specifically, in this example, SOC 600 includes CPU 610 that is a multi-core general-purpose processor having four processor cores, core 0-core 3. Of course, the scope of implementations is not limited to any particular number of cores, as other implementations may include two cores, eight cores, or any other appropriate number of cores in the CPU 610. SOC 600 further includes other system components, such as a first digital signal processor (DSP) 640, a second DSP 650, a modem 630, GPU 620, a video subsystem 660, a wireless local area network (WLAN) transceiver 670, and a video-front-end (VFE) subsystem 680. SOC 600 also includes RAM memory unit 690, which may operate as system RAM for any of the components 610-680.

As noted above, SOC 600 may include a CPU 610 having multiple cores 0-3, and one or more of those cores may execute computer-readable code providing the functionality of an operating system kernel. Furthermore, the example operating system kernel may include power management software that may perform cause any one or more of the components 610-680 to enter a sleep state or to wake from a sleep state. Accordingly, the principles described above with respect to FIGS. 1-5 may be implemented in SOC 600 and, more specifically, the circuits and methods shown in FIGS. 1-5 may be implemented in SOC 600 or other chip to provide control signal propagation in memories.

For instance, any one of the CPU cores in CPU 610 may execute computer readable code to provide the functionality of an operating system kernel, which may cause the modem 630 to be powered down or to wake back up. Furthermore, modem 630 may be built to include one or more LMEMs, such as those described above with respect to FIGS. 1-2. Each of those LMEMs may include a latch, such as latches 131, 141, and each of those latches may be controlled by a clamp signal that is provided by one of the cores of CPU 110.

Similarly, the sleep signal may be generated internally to the modem 630 and provided to the latches 131, 141, as described above with respect to FIGS. 1-5. And while this example refers to the modem 630 including LMEMs operating as described above respect to FIGS. 1-5, it is understood that any of the other components 610-620 and 640-680 may perform control system propagation as described herein.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A semiconductor device comprising:
   a first memory array having a first input and a first output and a delay line coupled to the first output;
   a control logic coupled to the first input;
   a latch disposed between the control logic and the delay line; and
   a plurality of logic gates between the control logic and the latch, the plurality of logic gates positioned at a data node and a data bar node of the latch, wherein each logic gate is coupled with a first control signal, and the first control signal is coupled with a gate of a transistor coupling the plurality of logic gates to a first power supply.
2. The semiconductor device of clause 1, wherein the first input comprises an inverter between a first logic gate of the plurality of logic gates and the control logic, further wherein the inverter is coupled to the transistor.
3. The semiconductor device of clauses 1-2, wherein the plurality of logic gates comprises a first NOR gate, which is coupled to the control logic through an inverter, and a second NOR gate which is coupled to the control logic at an input of the inverter.
4. The semiconductor device of clauses 1-3, wherein the latch is coupled to a second power supply, and wherein the control logic is coupled to a third power supply.
5. The semiconductor device of clause 4, wherein the first power supply and the third power supply are included in a first power domain, and wherein the second power supply is included in a second power domain, and wherein the first power domain is different from the second power domain.
6. The semiconductor device of clause 4, wherein the semiconductor device is configured to isolate the plurality of logic gates from the first power supply before the first input floats.
7. The semiconductor device of clauses 1-6, wherein the first memory array and a second memory array are coupled through the delay line.
8. The semiconductor device of clauses 1-7, wherein the first memory array comprises an inverter chain between the first input and the first output, the inverter chain coupled to a data output of the latch.
9. The semiconductor device of clauses 1-8, wherein the transistor comprises a P-channel metal-oxide-semiconductor (PMOS) device.
10. A method of operating a semiconductor device, the method comprising:
receiving a sleep signal at an input to a memory array from a control logic;
storing a value of the sleep signal in a latch, wherein the latch is disposed between the input and an inverter chain of the memory array;
isolating a plurality of logic gates between the input and the latch from a power supply; and
after isolating the plurality of logic gates, allowing the sleep signal to float.
11. The method of clause 10, further comprising: changing a status of the sleep signal from floating to either a high value or a low value, followed by restoring the power supply to the plurality of logic gates.
12. The method of clauses 10-11, further comprising: propagating the value of the sleep signal through the inverter chain of the memory array.
13. The method of clause 12, further comprising: providing the value of the sleep signal to a subsequent memory array.
14. An apparatus, comprising:
a memory array;
a control logic configured to provide a sleep signal to the memory array;
an input circuitry having an input and an output, the input of the input circuitry configured to receive the sleep signal from the control logic, and the input circuitry configured to operate in a first power domain;
a latch having a latch input and a latch output, the latch input coupled to the output of the control logic, the latch configured to store the sleep signal, wherein the input circuitry is configured to be electrically isolated from a power rail of the first power domain before the sleep signal floats; and
a delay line coupled between the latch output and the memory array.
15. The apparatus of clause 14, wherein the latch is configured to operate in a second power domain different from the first power domain.
16. The apparatus of clauses 14-15, wherein the delay line is configured to operate in the first power domain.
17. The apparatus of clause clauses 14-16, wherein the delay line is configured to pass the sleep signal stored in the latch to the memory array.
18. The apparatus of clauses 14-17, wherein the input circuitry comprises an inverter, a first NOR gate, a second NOR gate.
19. The apparatus of clause 18, wherein the inverter is coupled to the control logic and coupled to the first NOR gate, and wherein the second NOR gate is coupled to the control logic.
20. The apparatus of clause 19, wherein the inverter, the first NOR gate, and the second NOR gate are all configured to receive power from the power rail, the apparatus further comprising a P-channel metal-oxide-semiconductor (PMOS) transistor disposed between the power rail and each of the inverter, the first NOR gate, and the second NOR gate, and wherein the PMOS transistor is configured to receive a clamp signal at its gate.
21. The apparatus of clause 20, wherein the first NOR gate and the second NOR gate are configured to receive the clamp signal at NOR gate inputs.
22. A system on chip (SOC) comprising:
a memory array;
means for providing a sleep signal to the memory array;
means for receiving the sleep signal from the sleep signal providing means, the sleep signal receiving means including a plurality of logic circuits operating in a first power domain and being configured to be electrically isolated from a power rail of the first power domain during a time period in which the sleep signal floats;
means for storing a value of the sleep signal during the time period in which the sleep signal floats; and
means for causing a propagation delay in transmitting the value of the sleep signal to the memory array.
23. The SOC of clause 22, wherein the value storing means are configured to operate in a second power domain different from the first power domain.
24. The SOC of clauses 22-23, wherein the propagation delay causing means are configured to operate in the first power domain.
25. The SOC of clauses 22-25, wherein the sleep signal receiving means comprises an inverter, a first NOR gate, and a second NOR gate.
26. The SOC of clauses 22-25, wherein the sleep signal receiving means comprises an inverter coupled to the sleep signal providing means and to a first NOR gate, the sleep signal receiving means further comprising a second nor gate coupled to the sleep signal providing means.
27. The SOC of clause 26, wherein the inverter, the first NOR gate, and the second NOR gate are all configured to receive power from the power rail, the SOC further comprising a P-channel metal-oxide-semiconductor (PMOS) transistor disposed between the power rail and each of the inverter, the first NOR gate, and the second NOR gate, and wherein the PMOS transistor is configured to receive a clamp signal at its gate.
28. The SOC of clause 26, wherein the sleep signal providing means comprises a modem.

What is claimed is:
1. A semiconductor device comprising:
a first memory array having a first input and a first output and a delay line coupled to the first output;
a control logic coupled to the first input;
a latch disposed between the control logic and the delay line; and a plurality of logic gates between the control logic and the latch, the plurality of logic gates positioned at a data node and a data bar node of the latch, wherein each logic gate is coupled with a first control signal, and the first control signal is coupled with a gate of a transistor coupling the plurality of logic gates to a first power supply.

2. The semiconductor device of claim 1, wherein the first input comprises an inverter between a first logic gate of the plurality of logic gates and the control logic, further wherein the inverter is coupled to the transistor.

3. The semiconductor device of claim 1, wherein the plurality of logic gates comprises a first NOR gate, which is coupled to the control logic through an inverter, and a second NOR gate which is coupled to the control logic at an input of the inverter.

4. The semiconductor device of claim 1, wherein the latch is coupled to a second power supply, and wherein the control logic is coupled to a third power supply.

5. The semiconductor device of claim 4, wherein the first power supply and the third power supply are included in a first power domain, and wherein the second power supply is included in a second power domain, and wherein the first power domain is different from the second power domain.

6. The semiconductor device of claim 4, wherein the semiconductor device is configured to isolate the plurality of logic gates from the first power supply before the first input floats.

7. The semiconductor device of claim 1, wherein the first memory array and a second memory array are coupled through the delay line.

8. The semiconductor device of claim 1, wherein the first memory array comprises an inverter chain between the first input and the first output, the inverter chain coupled to a data output of the latch.

9. The semiconductor device of claim 1, wherein the transistor comprises a P-channel metal-oxide-semiconductor (PMOS) device.

10. A method of operating a semiconductor device, the method comprising:
receiving a sleep signal at an input to a memory array from a control logic;
storing a value of the sleep signal in a latch, wherein the latch is disposed between the input and an inverter chain of the memory array;
isolating a plurality of logic gates between the input and the latch from a power supply, and after isolating the plurality of logic gates, allowing the sleep signal to float.

11. The method of claim 10, further comprising:
changing a status of the sleep signal from floating to either a high value or a low value, followed by restoring the power supply to the plurality of logic gates.

12. The method of claim 10, further comprising:
propagating the value of the sleep signal through the inverter chain of the memory array.

13. The method of claim 12, further comprising:
providing the value of the sleep signal to a subsequent memory array.

14. An apparatus, comprising:
a memory array;
a control logic configured to provide a sleep signal to the memory array;
an input circuitry having an input and an output, the input of the input circuitry configured to receive the sleep signal from the control logic, and the input circuitry configured to operate in a first power domain;
a latch having a latch input and a latch output, the latch input coupled to the output of the control logic, the latch configured to store the sleep signal, wherein the input circuitry is configured to be electrically isolated from a power rail of the first power domain before the sleep signal floats; and
a delay line coupled between the latch output and the memory array.

15. The apparatus of claim 14, wherein the latch is configured to operate in a second power domain different from the first power domain.

16. The apparatus of claim 14, wherein the delay line is configured to operate in the first power domain.

17. The apparatus of claim 14, wherein the delay line is configured to pass the sleep signal stored in the latch to the memory array.

18. The apparatus of claim 14, wherein the input circuitry comprises an inverter, a first NOR gate, a second NOR gate.

19. The apparatus of claim 18, wherein the inverter is coupled to the control logic and coupled to the first NOR gate, and wherein the second NOR gate is coupled to the control logic.

20. The apparatus of claim 19, wherein the inverter, the first NOR gate, and the second NOR gate are all configured to receive power from the power rail, the apparatus further comprising a P-channel metal-oxide-semiconductor (PMOS) transistor disposed between the power rail and each of the inverter, the first NOR gate, and the second NOR gate, and wherein the PMOS transistor is configured to receive a clamp signal at its gate.

21. The apparatus of claim 20, wherein the first NOR gate and the second NOR gate are configured to receive the clamp signal at NOR gate inputs.

22. A system on chip (SOC) comprising:
a memory array;
means for providing a sleep signal to the memory array;
means for receiving the sleep signal from the sleep signal providing means, the sleep signal receiving means including a plurality of logic circuits operating in a first power domain and being configured to be electrically isolated from a power rail of the first power domain during a time period in which the sleep signal floats;
means for storing a value of the sleep signal during the time period in which the sleep signal floats; and
means for causing a propagation delay in transmitting the value of the sleep signal to the memory array.

23. The SOC of claim 22, wherein the value storing means are configured to operate in a second power domain different from the first power domain.

24. The SOC of claim 22, wherein the propagation delay causing means are configured to operate in the first power domain.

25. The SOC of claim 22, wherein the sleep signal receiving means comprises an inverter, a first NOR gate, and a second NOR gate.

26. The SOC of claim 22, wherein the sleep signal receiving means comprises an inverter coupled to the sleep signal providing means and to a first NOR gate, the sleep signal receiving means further comprising a second nor gate coupled to the sleep signal providing means.

27. The SOC of claim 26, wherein the inverter, the first NOR gate, and the second NOR gate are all configured to receive power from the power rail, the SOC further comprising a P-channel metal-oxide-semiconductor (PMOS) transistor disposed between the power rail and each of the inverter, the first NOR gate, and the second NOR gate, and wherein the PMOS transistor is configured to receive a clamp signal at its gate.

28. The SOC of claim 26, wherein the sleep signal providing means comprises a modem.

\* \* \* \* \*